United States Patent [19]

Hart et al.

[11] 4,177,922

[45] Dec. 11, 1979

[54] MOTOR DRIVEN RESET MECHANISM FOR CUMULATIVE DEMAND REGISTER

[75] Inventors: David G. Hart, Clemson; Norman B. Venaas, Seneca, both of S.C.

[73] Assignee: Sangamo Weston, Inc., Atlanta, Ga.

[21] Appl. No.: 833,175

[22] Filed: Sep. 8, 1977

[51] Int. Cl.² .................. G06C 15/42; G01R 11/02
[52] U.S. Cl. ................. 235/144 MA; 324/103 R; 235/144 ME
[58] Field of Search ........ 235/144 MA, 104, 144 ME; 324/103 R

[56] References Cited

U.S. PATENT DOCUMENTS

| 1,654,730 | 1/1928  | Holtz       | 235/144 MA |
| 2,006,321 | 6/1935  | Stark et al.| 235/144 MA |
| 2,259,314 | 10/1941 | Lewis et al.| 235/144 MA |
| 2,280,161 | 4/1942  | Rosenberger | 235/144 MA |
| 2,531,038 | 11/1950 | Hamill      | 324/103 R  |
| 3,423,019 | 1/1969  | Ham         | 235/144 MA |
| 4,074,192 | 2/1978  | Hart        | 235/144 MA |

FOREIGN PATENT DOCUMENTS 436787 10/1935 United Kingdom .
1033595 6/1966 United Kingdom .

*Primary Examiner*—Stephen J. Tomsky
*Attorney, Agent, or Firm*—Emrich, Root, O'Keeffe & Lee

[57] ABSTRACT

A meter includes a single sweep hand dial for indicating maximum demand in a predetermined time period as well as a multidial decade register for recording cumulative demand. The sweep hand dial is driven by a pusher gear. A pusher arm urges the pusher gear in a first rotational direction to record maximum demand during the period. To reset the mechanism, a button is pushed manually to axially displace a reset gear into meshing engagement with a relatively high speed gear train driven by the timer motor. As the reset gear is thus moved, pins on the reset gear are displaced from stowage slots in a plate, and as the reset gear rotates, the pins ride on the plate until the reset gear completes a full cycle of operation during which time another pin on the reset gear engages a second tab on the pusher gear to reset the pusher gear in a rotational direction counter to that in which the pusher arm had rotated the pusher gear. During reset, the pusher gear drives a memory gear train provided with a unidirectional drive to transfer the maximum period demand to the cumulative demand register. When the reset gear completes its cycle, the pins are forced back into their stowage slots to disengage the reset gear from its drive. A reset spring urges one of the pins on the reset gear against an edge of its stowage slot to insure accurate zero reset of the reset gear. One tab on the pusher gear is adjustable to facilitate synchronization between the pusher arm and the reset gear.

10 Claims, 6 Drawing Figures

MOTOR DRIVEN RESET MECHANISM FOR CUMULATIVE DEMAND REGISTER

FIELD OF THE INVENTION

The present invention relates to a cumulative demand register such as is sometimes used in combination with a watthour meter for recording electrical demand. In addition to indicating cumulative demand, a single sweep hand dial may be used to indicate maximum demand in a predetermined period, such as the time between billing periods. This is referred to as the period maximum demand register. In particular, the present invention relates to a manually actuated mechanism for resetting the period maximum demand register to zero while simultaneously transferring the contents of that register to the cumulative demand register.

SUMMARY OF THE INVENTION

In addition to the conventional kilowatt hour decade dial register, a meter of the type with which the present invention is concerned also includes a cumulative demand register and a period maximum demand register. The cumulative demand register is similar in appearance to the kilowatt hour register in that it includes decade dials, and it is intended to record the cumulative maximum demand. The period maximum demand register is in the form of a single sweep hand dial, and it indicates maximum demand in a predetermined time such as the time between billing periods. The maximum demand reading itself, of course, indicates the maximum power demand during a much shorter time interval, of the order of 15-30 minutes. The time between billings may be of the order of one month.

Thus, at the time the meter is read, the maximum power demand occurring since the last reading is indicated on the single, larger dial comprising the period maximum demand register. Prior to resetting, the cumulative maximum demand register indicates the cumulative maximum demand for all previous billings. Upon reset, the period maximum demand dial indicator is set to zero, and its contents are transferred to the cumulative demand register. Thus, the difference between the two kilowatt readings on the cumulative demand register (before and after zero reset) is a measure of the maximum demand for the given billing period.

According to the present invention, the sweep hand dial is driven by a pusher gear. The pusher gear is driven in a first rotational direction, sometimes referred to as the "recording" direction, by means of a pusher arm to record maximum demand during the billing period. The pusher arm, in turn, is periodically reset, but the sweep hand of the period maximum demand register is not reset. Rather, it is reset manually during a meter reading. To reset the mechanism, a button is pushed to axially displace a reset gear and place it into meshing engagement with a relatively high-speed gear train driven by the timer motor. As the reset gear is axially displaced, hold-out pins on the reset gear are moved out of their associated stowage slots in a fixed plate. As soon as the reset gear is axially displaced it is driven in rotation, and the hold-out pins ride on the plate until the reset gear completes a full cycle of operation.

The reset gear is provided with a reset pin which is adapted to engage a second tab on the pusher gear as the reset pin is rotated to the position at which the pusher gear had been left in accordance with the maximum demand recorded during the billing period. The reset pin thus urges the pusher gear in a rotational direction counter to the recording direction, sometimes referred to as the "reset" direction. During reset, the pusher gear also drives a memory gear train provided with a unidirectional drive to transfer the maximum period demand to the cumulative demand register.

When the reset gear completes its cycle, the hold-out pins are forced back into their stowage slots to disengage the reset gear from its drive. A reset spring urges one of the hold-out pins on the reset gear against an edge in its stowage slot to insure accurate zero reset of the reset gear.

As mentioned, the pusher gear includes two tabs, one of which is engaged by the pusher arm to move the pusher gear in the recording direction, and the other of which is engaged by the reset pin on the reset gear to urge the pusher gear in the counter direction, namely the reset direction. These two tabs are arranged in such a manner that the angular displacement between them is adjustable, and this facilitates synchronization of the reset gear, pusher gear, and the pusher arm to achieve a high resolution period maximum demand register even though the tolerances on the individual elements are not stringent. A single, simple adjustment permits the high resolution without costly parts or procedures.

Further, with the present structure, the hold-down time for the reset button is approximately 1-1½ seconds. Once the hold-out pins are free of their stowage slots, it is insured that the reset gear will complete its reset cycle, and no further attention need be given the reset mechanism by the reader. Further, the period maximum demand register is reset to zero and the contents transferred to the cumulative demand register in approximately 30 seconds. This is approximately one-half the time required for reset of the next fastest competing meter, and amounts to a considerable time saving over the period of a day when it is realized that as many as 100 meters may be read in a day. Other features and advantages such as the simple adjusting feature of the tabs on the pusher gear, the reliability and lack of complexity of the memory transfer train, the greater angular travel of the pusher arm, and so on, will be appreciated by persons skilled in the art from the following detailed description of a preferred embodiment accompanied by the attached drawing wherein identical reference numerals will refer to like parts in the various views.

THE DRAWING

DETAILED DESCRIPTION

Figure 1:
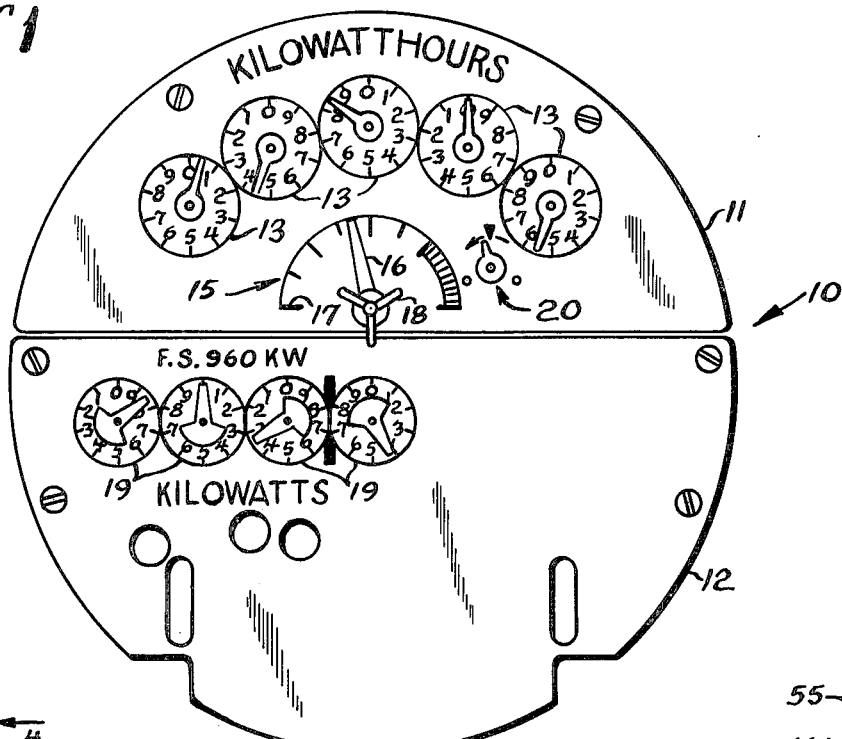
FIG. 1 is a front elevational view of a faceplate of an electric power meter incorporating the present invention.

Referring first to FIG. 1, reference numeral 10 generally designates a faceplate of a meter including an upper faceplate portion 11 and a lower faceplate portion 12. At the top of the upper faceplate portion 11 there are five decade dials 13 forming a conventional kilowatt hour power register for recording consumption of electrical power. The five dials 13 are arranged on a curve to facilitate placement on the upper faceplate portion 11. Also on the upper faceplate portion 11 is a period maximum demand register generally designated 15 and including a single sweep hand 16 arranged to record period maximum demand from a reset position 17 in a clockwise rotation. A reset button 18 is arranged concentrically with the shaft of the indicating hand 16.

Four decade dials designated 19 are arranged in a straight line on the lower faceplate portion 12, and these comprise a cumulative demand register.

The maximum demand which occurs during a billing period is indicated on the period maximum demand register 15 which, it will be observed, includes a larger dial and indicating hand, and is located near the center of the faceplate. When the period maximum demand register 15 is reset, the greatest demand which occurred during the period since the last reading is added to the amount previously stored in the cumulative demand register. Specifically, when the reset button 18 is depressed into the plane of the page of FIG. 1, the indicating hand 16 rotates counterclockwise to the reset position 17; and at the same time, the contents of the period maximum demand register are transferred to the cumulative demand register 19. The difference between these two kilowatt readings is the maximum demand for the period since the last meter reading.

Figure 2:
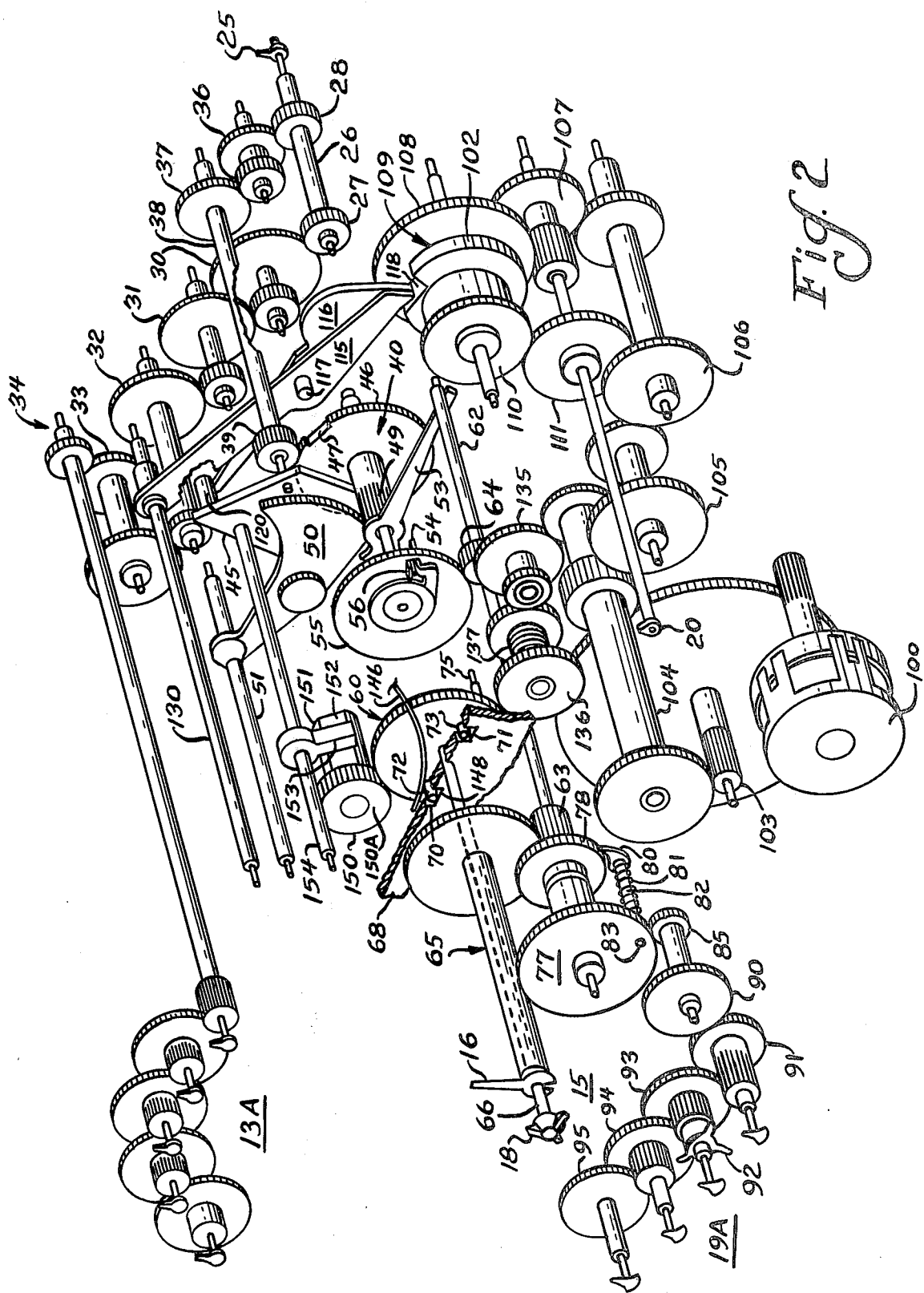
FIG. 2 is an exploded perspective view of the moving parts of the meter of FIG. 1 illustrating the structure and operation of the period maximum demand register and the cumulative demand register.

A small pointer designated 20 indicates the time remaining in a demand interval. Referring now to FIG. 2, there is shown the various gears, shafts, drive trains, etc. which provide the working mechanism of the meter. All of the elements are supported on plates similar to the faceplate 10 but spaced therefrom by means of spacers in a manner well-known in the art. These spaced support plates are not shown in FIG. 2, except for a portion of one of the plates, in order to better illustrate the working mechanism of the invention. Persons skilled in the art will, however, readily appreciate the need for and location of such support plates.

Referring now to the upper left-hand portion of FIG. 2, reference numeral 13A generally designates the five-dial conventional kilowatt hour register. Reference numeral 19A, see the lower left-hand portion of FIG. 2, generally designates the cumulative demand register, and the indicating hand 16 of the period maximum demand register 15 is also illustrated.

The input to the meter is coupled to a dog 25 which drives a staff 26 on which first and second gears 27, 28 are fixed. The gear 27 drives reduction gears 30, 31, 32, 33, the latter of which drives a staff assembly 34 coupled to the indicating hand of the least significant digit of the kilowatt hour register 13A. The gear train comprising the gears 30–34 is referred to as the Register Ratio Train or simply the Rr train.

The gear 28 drives gears 36 and 37, the latter of which is connected to a staff 38 having its distal end provided with a gear 39 which advances a center staff 40. The staff 38 has its forward end connected to a rotatable plate 45 which, as will be described, may be used to lift the staff 38. Hence, the staff 38 forms a wobble staff and may be selectively engaged to and disengaged from the center staff 40. The center staff 40 includes a larger gear 46 having a portion 47 missing, but otherwise in engagement with the gear 39 of the wobble staff 38. The center staff 40 also includes a pinion 49 which engages a sector gear 50 mounted to a shaft 51. The center staff 40 also includes a pusher arm 53 which is adapted to engage an adjustable tab 54 of a pusher gear 55. The pusher gear 55 also includes a fixed tab 56 extending from the other side thereof and facing a reset gear generally designated 60.

The axis of rotation of the pusher gear 55 is collinear with the axis of rotation of the pusher arm 53, center staff 40, reset gear 60, and indicating hand 16 of the period maximum demand register.

Briefly, the operation of the parts just described is as follows. As demand increases in a given demand interval, the center staff 40 is driven by the PAR train 28, 36, 37 so that the wobble staff 38 drives the center staff 40 to rotate the pusher arm 53 in a clockwise direction. The pusher arm 53 is in a reset position as shown in FIG. 2 when it engages the underside of an RD staff 62.

Assuming the pusher gear has been fully reset, as will be further described below, as demand increases, the pusher arm 53 engages the tab 54 on the pusher gear 55 to rotate the pusher gear in a clockwise or recording direction. At the same time, the pinion 49 on the center staff raises the sector gear 50 (which is shown in the fully raised position for clarity of illustration, even though the pusher arm 53 is illustrated in a reset position).

After the predetermined demand interval has lapsed, the plate 45 is rotated counterclockwise to raise the wobble staff 38, and the weight of the sector gear 50 drives the pusher arm 53 counterclockwise back to the reset position, but the pusher gear 55 remains where it has been left by the pusher arm 53.

If, during a subsequent demand measuring interval, the previous demand is exceeded, then the pusher arm further rotates the pusher gear 55 in the recording direction by urging the tab 54 clockwise. When the pusher arm is in the reset position illustrated, and the reset gear 55 is in the starting position, the tab 54 extends beneath the pusher arm 53, as mentioned.

The pusher gear 55 thus forms a storage means for recording maximum demand; and its angular displacement from a reset position is a measure of the maximum demand during previous recording intervals.

The pusher gear 55 meshes with a gear 64 on the Rd staff 62. The Rd staff is also provided with a pinion 63 which drives a test dial staff generally designated 65 on which the indicating hand 16 is mounted. The reset button 18 is mounted on a shaft 66 which extends through the test dial staff 65, and through a plate 68 shown in fragmentary form where it is connected to the center of the reset gear 60. The plate 68 is a conventional support plate of the type previously described and one of a number of such plates in conventional meters. However, it includes a pair of stowage slots 70, 71 into which a pair of hold-out pins 72, 73 are received respectively. The hold-out pins 72, 73 are attached to one side of the reset gear 60, and they are located at different spacings from the axis of rotation of the reset gear. Hence, the pin 73 will not fall into the slot 70 when the reset gear is rotated, nor will the pin 72 fall into the slot 71. On the other side of the reset gear 60 there is located a reset pin 75, the function of which will be described presently.

As previously indicated, when the pusher gear 55 is driven by the pusher arm 53 in its recording rotational direction, it drives the Rd staff 62 which, in turn, drives the test dial staff 65 to turn the indicating hand 16 in a clockwise direction.

At the extreme left end of the Rd staff 62, there is located a larger gear 77 which is permitted to rotate relative to the shaft of the staff 62, whereas the pinion 63 is fixed to the shaft. Another gear 78 is also fixed to the shaft of the Rd staff and it includes a ratchet surface which is engaged by a pawl 80 mounted by means of a spring 81 on a shaft 82 staked at 83 to the gear 77. When the pusher gear 55 is driven clockwise in the recording rotational direction, the staff 62 is driven counterclockwise, and the pinion 63 drives the test staff as described. However, during this time the ratchet 78 overrides the pawl 80 and the gear 77 does not rotate due to the loading of clutch spring 92. When the pusher gear 55 is rotated in the reset direction, the ratchet 78 is driven clockwise, thereby engaging the pawl 80 and driving the gear 77. The ratchet/pawl arrangement thus comprises a unidirectional drive means for the gear 77 which is responsive only to the driving of the pusher gear in the reset direction and is not responsive to rotation of the pusher gear in the recording direction.

The gear 77 meshes with a gear 85 which is connected to a larger gear 90 which meshes with a gear 91 connected to the indicator hand for the least significant digit of the maximum demand register 19A. The combination of gears 77, 85, 90 and 91 is sometimes referred to as the memory drive train, since it is used to transfer the recorded information representative of maximum demand since the last meter reading from the pusher gear 55 (as also represented on the indicating hand 16 of the period maximum demand register 15) to the cumulative demand register 19A. The second demand staff is provided with a clutch spring 92. The indicator hands are driven by a decade gear arrangement comprising the gear 91 and gears 93, 94 and 95.

The apparatus which determines the demand interval will now be described. It includes a timing motor 100 which drives a timing cam 102 through reduction staffs 103, 104, 105, 106 and 107, the latter being provided with a pinion driving a larger gear 108. The gear 108 is coupled to the timing cam 102 by means of a spring-loaded clutch at 109 located between the cam 102 and the driving gear 108. The clutch allows manual advancement of the timing interval for testing purposes of readjustment to the beginning of an interval. A one/one gear reduction 110, 111 drives the indicator hand 20 which displays the time left in an interval. The length of the demand interval is determined by the reduction gearing between the motor 100 and the timing cam 102. A pair of levers 115, 116 are connected together by means of a pin 117 which permits them to rotate relative to one another. The length of the lever 116 (which may be weighted in a clockwise direction) is slightly shorter than the lever 115 relative to the pin 117. Thus, the lever 116 will fall off the cam surface 102 into a detent 118 before the lever 115 will fall. Typically, the interval may be six seconds. The distal end of the lever 116 engages the underside of a pin 120 connected to the plate 45 which supports one end of the wobble staff 38. Thus, when the lever 116 falls, it raises the plate 45 by urging the pin 120 upward, thereby disengaging the gear 39 from the center staff 40, and permitting the weighted sector gear 50 to drive the pinion 49 counterclockwise to reset the pusher arm 53. A short time later, when the lever 115 falls off the cam surface 102 and the center staff 40 and pusher arm 53 are reset, the wobble staff 38 is brought back into engagement with the gear 46. The far end of the lever 115 is rotatably mounted on a shaft 130 which may be mounted between two spaced support plates.

The reset mechanism for the center staff 40 is considered advantageous because the force of gravity on the sector gear 50 is constant, thereby resulting in uniform reset action of the center staff and the pusher arm 53. Further, the interval between disengagement of the wobble staff 38 and re-engagement with the drive gear 46 for the center staff is a short, controlled time, and the center staff is immediately driven upscale upon re-engagement of the gear 39 on the wobble staff 38.

The previously mentioned compound gear 104 which is driven by the timing motor 100 also drives another pair of compound gears 135, 136, the latter being provided with a spring clutch 137 to protect it from temporary misalignment with the reset gear 60 when the reset gear is axially displaced as the reset button is pushed, as will be described below. This spring clutch further protects the timing motor from excessive torque conditions.

Figure 5:
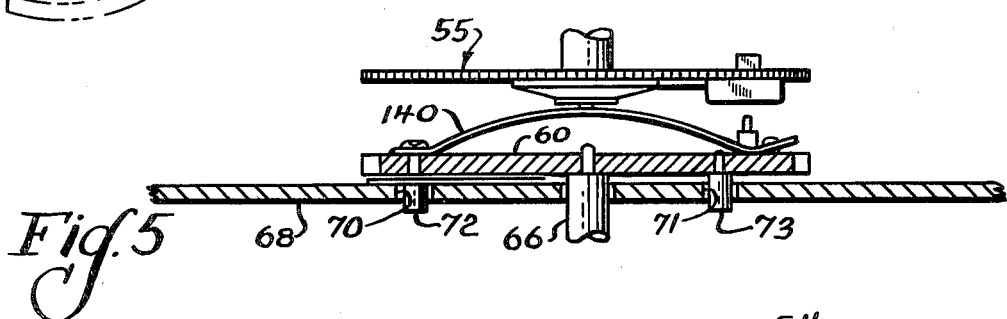
FIG. 5 is a horizontal cross sectional view of the reset gear in the fully reset positions and FIG. 6 is a close-up top view of the reset gear as it commences a reset cycle.
Figure 6:
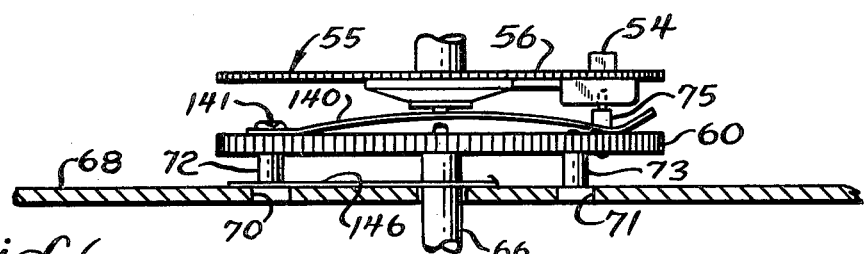

Referring now to FIGS. 5 and 6, a leaf spring 140 is attached by means of a rivet 141 to the surface of the reset gear 60 which faces the pusher gear 55, and this leaf spring urges the reset gear away from the pusher gear such that when the hold-out pins 72, 73 are in register with their associated stowage slots 70, 71, they will fall into those slots, and restrain the reset gear from rotating. A reset spring 146 is fastened to the back of the plate 68, although it is shown only partially in FIGS. 5 and 6 for clarity, for engaging the hold-out pin 72 to urge the reset gear counterclockwise. The function of the reset spring 146 is to urge the pin 72 into engagement with the lower edge (see 148 in FIG. 2) of its associated stowage slot 70. This assures precise location of the zero reset position of the reset gear 60.

Referring now to the upper central portion of FIG. 2, the reset gear 60 is in meshing engagement with a cam gear 150 provided with a round cam 151 having a flat 152. A dog 153 mounted on a shaft 154 is engaged by the cam 151, and it rotates the shaft 154 on which the previously-described plate 45 is mounted. Briefly, the dog 153 lies against the flat 152 of the cam 151 when the reset gear 60 is in the reset position. When the reset gear 60 is rotated in a reset cycle, the cam 151 rotates the dog 153 to lift the plate 45, thereby disengaging the wobble staff 38 and permitting the sector gear 50 to urge the pusher arm 53 back to its reset position.

As an alternative to having the reset spring 146 urging the hold-out pin 72 as illustrated, the cam gear 150 may be provided with a pin extending from its surface 150A and the reset spring may urge the cam gear clockwise to insure the pin 72 is bottomed in slot 70.

To reset the period maximum demand register 15 and transfer the contents thereof to the cumulative demand register 19A, the reset button 18 is depressed. This causes the reset gear 60 to be axially displaced from the position of FIG. 5 to the position of FIG. 6, further compressing the leaf spring 140, and disengaging the hold-out pins 72, 73 from their associated stowage slots. Further, in the axially displaced position of FIG. 6, the reset gear 60 engages the compound gear 136, which, it will be recalled, is continuously driven by the timer motor 100. After a brief interval in which the two gears mesh, the reset gear 60 rotates counterclockwise. After this short interval, of the order of 1-1½ seconds, the reset button 18 may be released, and the pins 72, 73 are dimensioned such that while they ride on the back of the plate 68, the reset gear 60 will be held in the position of FIG. 6. It will also be observed from FIG. 6 that the reset pin 75 is now in a position to engage the tab 56 on the pusher gear 55 which is shown near a maximum demand level. The reset gear 60 will thus be driven in a full 360 degree reset cycle counterclockwise, and the reset pin 75 will engage the tab 56 on the pusher gear at whatever angular disposition the pusher gear had been left by the pusher arm 53.

At the beginning of the reset cycle, the gear 150 will have caused the cam 151 to turn the dog 153, releasing the wobble staff 38 and permitting the weighted sector gear to move the pusher arm 53 out of the way and back to its reset position.

The reset gear 60 is thus driven into a complete reset cycle, and the pusher gear 55 will be urged back to its reset position. As the pusher gear 55 is reset, it drives the Rd staff 62 in a clockwise direction, thereby engaging the ratchet 78 and pawl 80 so that the gear 77 and the reset of the memory transfer train is also driven to transfer the contents of the pusher gear 55 (which is the same as the maximum demand indicated on the period maximum demand register) to the cumulative demand register 19A.

Figure 3:
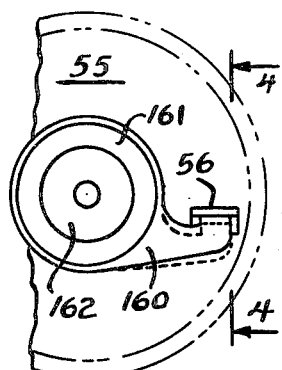
FIG. 3 is a front view of the pusher gear illustrating the adjustability of one tab, with the left portion of the gear cut away for brevity.
Figure 4:
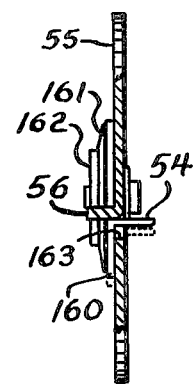
FIG. 4 is a vertical cross sectional view of the pusher gear taken through the slight line 4—4 of FIG. 3.

Referring now to FIGS. 3 and 4, the reset gear 55 includes a lever 160 which is pressed against one surface of the gear 55 by means of a frusto-conical spring washer 161. The washer 161, in turn, is held by means of a hub 162. The outer end of a lever 160 is formed to provide the previously described tab 54 which fits through a slot 163 on the pusher gear. It is the tab 54 which is engaged by the pusher arm 53. The tab 56, on the other hand, is formed from the material removed in the formation of the slot 163. With this structure, the lever 160 may be rotated by hand, as indicated by the two positions in FIG. 3, to facilitate synchronization of the reset gear 60 with the pusher arm 53. That is to say, with the pusher arm 53 in the reset position, and the tab 56 immediately beneath the reset pin 75 at the beginning of a demand period measurement, the tab 54 is adjusted to be immediately below the pusher arm 53 by moving the lever 160. Once adjusted, of course, the spring 161 holds the lever 160 in place.

To summarize the advantages of the present invention, one feature is that the reset button 18 need be held down only for a short time of the order of one - one and a half seconds; and once this is accomplished, the reset gear 60 will go through a complete reset cycle until the hold-out pins 72, 73 rotate a full 360 degrees and are driven back into their associated stowage slots by the leaf spring 140. Further, because the drive gear train 103, 104, 135, 136 which drives the reset gear 60 may be a relatively high speed train, the reset gear 60 may be completely cycled in about 30 seconds.

Another feature of the present invention is the adjustability of the tab 54 on the pusher gear 55 to facilitate synchronization of the reset gear 60 with the pusher arm 53 and center staff 40 to achieve a high resolution on the period maximum demand register 15 and the cumulative demand register 19A with relatively inexpensive and low tolerance parts.

Another feature of the present invention is the unidirectional drive between the center staff 62 and the memory drive train comprising gears 77, 85, 90 and 91 responsive only to rotation of the pusher gear 55 only in the reset direction and not in the recording direction due to the loading of clutch spring 92. This permits the contents of the period maximum demand register to be advanced during a timing interval without advancing the cumulative demand register, while transferring the contents of the period maximum demand register to the cumulative demand register only during reset.

Another advantage of the present invention is the provision of the spring 146 for urging the hold-out pin 72 on the reset gear against the edge 148 of its associated stowage slot 70 to achieve accurate reset to zero of the reset gear.

Having thus described in detail a preferred embodiment of the invention, persons skilled in the art will be able to modify certain of the structure which has been illustrated and to substitute equivalent elements for those disclosed while continuing to practice the principle of the invention; and it is, therefore, intended that all such modifications and substitutions be covered as they are embraced within the spirit and scope of the appended claims.

We claim:

1. In an electrical power meter, the combination of a period maximum demand register comprising a dial including an indicating hand; first gear means including pusher gear means rotatable in a recording direction and a reset direction, said first gear means operably connected to advance and reset said period maximum demand register when said pusher gear means is rotated in said recording and reset directions respectively, the angular displacement of said pusher gear means being representative of maximum demand in a predetermined period; second gear means responsive to an input drive for driving said pusher gear in said recording direction; reset means for periodically resetting said pusher arm means to a reset position; and a cumulative demand register; reset drive means; means including a reset gear having first and second axially displaced positions; said reset gear further including hold-out pin means extending from one surface thereof; a fixed plate adjacent said one surface of said reset gear and defining stowage slot means adapted to receive said hold-out pin means when said reset gear is in said first axial position, said hold-out pin means riding on said plate when said reset gear is in said second axial position; reset spring means for biasing said reset gear when said pin means is received in said stowage slot means for urging said pin means against one edge of said stowage slot means to define the zero reset position of said reset gear; manual reset means for moving said reset gear to said second axial position, said reset gear engaging said reset drive means in said second axial position and adapted to engage said pusher gear to drive the same in the reset direction; and third gear means including unidirectional drive means responsive only to the turning of said reset gear in said reset direction to advance said cumulative demand register by an amount representative of the angular displacement of said pusher gear from its initial position, said reset drive means being further operative to reset said period maximum demand register when said pusher gear means is driven in the reset direction.

2. The apparatus of claim 1 wherein said reset drive means comprises a continuously running timing motor; and a fourth drive gear train adapted to engage said reset gear in said second axial position for turning said reset gear in a complete revolution.

3. The apparatus of claim 2 wherein said reset drive means is adapted to turn said reset gear in said complete revolution in approximately thirty seconds.

4. The apparatus of claim 3 wherein said fourth drive gear train includes a compound gear having a spring clutch to reduce the torque on said timing motor when said reset gear is engaged.

5. The apparatus of claim 1 wherein said first gear means includes a rotatable staff assembly directly interconnecting said pusher gear means with the indicating hand of said maximum demand register; and a ratchet connected to said staff assembly for rotation therewith; and wherein said unidirectional drive means includes a pawl engaging said ratchet, said ratchet slipping over said pawl when said pusher gear is rotated in the recording direction whereby the indicating hand of said maximum demand register is rotated proportional to the angular displacement of said pusher gear in the recording direction, said ratchet engaging and urging said pawl when said pusher gear is rotated in the reset direction; and memory transfer gear means connected to said pawl and adapted to rotate therewith to advance said cumulative demand register by an amount representative of the angular displacement of said pusher gear from its initial position only when said pusher gear is driven in the reset direction.

6. The apparatus of claim 1 further comprising a continuously driven timer motor; fifth gear means driven by said timer motor and including a cam surface providing a detent; first and second pivotally interconnected levers riding on said cam surface, said first lever being adapted to fall into said detent prior to the falling of said second lever; means for pivotally supporting said second lever; said second gear means including a wobble staff driven by said input drive at one end; movable plate means supporting the other end of said wobble staff; a reset staff including a gear interconnected with said wobble staff and driven thereby when said plate is in a first position, said pusher arm being connected to said reset staff; a pivotal sector gear engaging said reset staff at one end, said reset staff raising said sector gear when said pusher arm urges said pusher gear in the recording direction; one end of said first lever engaging said plate means to move said plate means to said second position to thereby disengage said wobble staff from said reset gear when the other end of said first lever falls into said detent, said sector gear urging said reset staff to said reset position, said plate moving to said first position to re-engage said wobble staff with said reset gear when said second lever falls into said detent.

7. The apparatus of claim 1, further comprising sixth gear means including a cam defining a flat and driven by said reset gear in said second axial positions; a dog engaging the flat of said cam when said reset gear is in the reset position and interconnected with said plate means for rotating the same to said second position in response to the rotation of said reset gear, whereby when said reset gear engages its associated drive train, said sixth gear means urges said dog to move said plate to said second position, thereby disengaging said wobble staff and resetting said pusher arm when said reset gear is driven in said reset direction.

8. The apparatus of claim 1 wherein said reset gear includes a flat gear; a lever arm frictionally engaging one surface of said flat gear and having a distal end extending outwardly of said surface to define one of said tabs; and spring washer means urging said lever against said surface of said reset gear, whereby the angular displacement between said first and second tabs of said reset gear may be adjusted manually to facilitate synchronization of said pusher arm with said reset gear.

9. In an electrical power meter having a period maximum demand register comprising a dial including an indicating hand; first gear means including pusher gear means rotatable in a recording direction and a reset direction, said pusher gear means including first and second oppositely extending tabs, said first gear means operably connected to advance and reset said period maximum demand register when said pusher gear means is rotated in said recording and reset directions respectively; second gear means including a rotatable pusher arm adapted to engage said first tab on said pusher gear means responsive to an input drive for driving said pusher gear in said recording direction; reset means for periodically resetting said pusher arm means to a reset position; and a cumulative demand register comprising a plurality of decade dials forming a dial register; reset drive means; means including a reset gear having first and second axially displaced positions, said reset gear engaging said reset drive means in said second axial position and having a reset pin engaging said second tab of said pusher gear to drive the same in the reset direction, said tabs on said pusher gear being adjustable angularly to facilitate synchronizing said reset gear with said pusher arm; and third gear means including unidirectional drive means responsive to the turning of said reset gear only in said reset direction to advance said cumulative demand register by an amount representative of the angular displacement of said pusher gear from its initial position, said reset drive means being further operative to reset said period maximum demand register when said pusher gear means is driven in the reset direction.

10. In an electrical power meter, the combination of a period maximum demand register comprising a dial including an indicating hand; first gear means including pusher gear means rotatable in a recording direction and a reset direction, said first gear means operably connected to advance and reset said period maximum demand register when said pusher gear means is rotated in said recording and reset directions respectively; second gear means including a rotatable pusher arm adapted to engage said pusher gear means responsive to an input drive for driving said pusher gear in said recording direction; reset means for periodically resetting said pusher arm means to a reset position; and a cumulative demand register comprising a plurality of decade dials forming a dial register; reset drive means; means including a reset gear having hold out pin means extending therefrom; a plate defining stowage slot means for receiving said hold out pin means when said reset gear is in a reset position, said reset gear being axially displaceable in a reset cycle; said reset gear engaging said reset drive means in said displaced position and adapted to engage said pusher gear to drive the same in the reset direction; means for biasing said reset gear in the direction of rotation for a reset cycle to urge said hold out pin means against one edge of said stowage slot means; cam gear means responsive to rotation of said reset gear to reset said pusher arm at the beginning of a reset cycle; and third gear means including unidirectional drive means responsive to the turning of said reset gear only in said reset direction to advance said cumulative demand register by an amount representative of the angular displacement of said pusher gear from its initial position, said reset drive means being further operative to reset said period maximum demand register when said pusher gear means is driven in the reset direction.

* * * * *